United States Patent [19]
Blaich et al.

[11] 4,105,821
[45] Aug. 8, 1978

[54] SILICON OXIDE COATED METAL HAVING IMPROVED CORROSION RESISTANCE

[75] Inventors: Bernhard Blaich, Stuttgart; Ernst Zehender, Ottenbronn; Karl Kerner, Gerlingen, all of Germany

[73] Assignee: Robert Bosch GmbH, Gerlingen-Schillerhohe, Germany

[21] Appl. No.: 711,842

[22] Filed: Aug. 5, 1976

[30] Foreign Application Priority Data

Aug. 13, 1975 [DE] Fed. Rep. of Germany ....... 2536013

[51] Int. Cl.² .......................... B32B 7/02; B32B 15/04
[52] U.S. Cl. .................................... 428/215; 427/95; 427/248 C; 427/248 H; 428/336; 428/337; 428/447; 428/450
[58] Field of Search ............... 428/450, 447, 215, 336, 428/337; 427/95, 255, 248 J, 248 C, 248 H, 163, 93

[56] References Cited

U.S. PATENT DOCUMENTS 2,748,031   5/1956   Kafig ..................................... 428/209
2,904,450   9/1959   Irland .................................... 428/215
3,352,712  11/1967   Polinsky .............................. 428/446
3,984,581  10/1976   Dobler .............................. 427/248 J
3,991,234  11/1976   Chang .............................. 427/248 J

FOREIGN PATENT DOCUMENTS 2,132,866   3/1972   Fed. Rep. of Germany ........... 427/255
1,352,401   5/1974   United Kingdom.
1,229,473   4/1971   United Kingdom ...................... 427/95
706,003   3/1954   United Kingdom ..................... 427/255

Primary Examiner—Ellis Robinson
Attorney, Agent, or Firm—Flynn & Frishauf

[57] ABSTRACT

The present invention provides a process for preparing silicon oxide layers on a substrate, and particularly on metal, having improved corrosion-protective properties. This is accomplished by making the silicon oxide protective layer hydrophobic, preferably by incorporating therein hydrophobic organosilicon residues. The protective layers are preferably prepared by vapor deposition in a vessel containing silicon and/or silicon oxides in the gasous form, oxygen, and a organosilicon compound containing at least one hydrophobic group bonded to the silicon.

13 Claims, 2 Drawing Figures

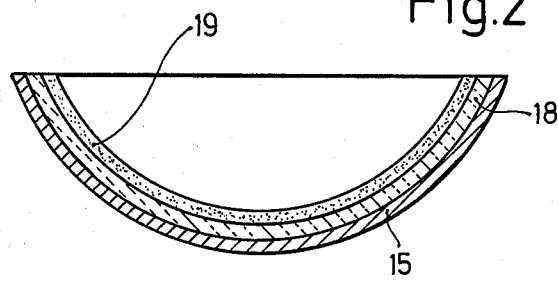
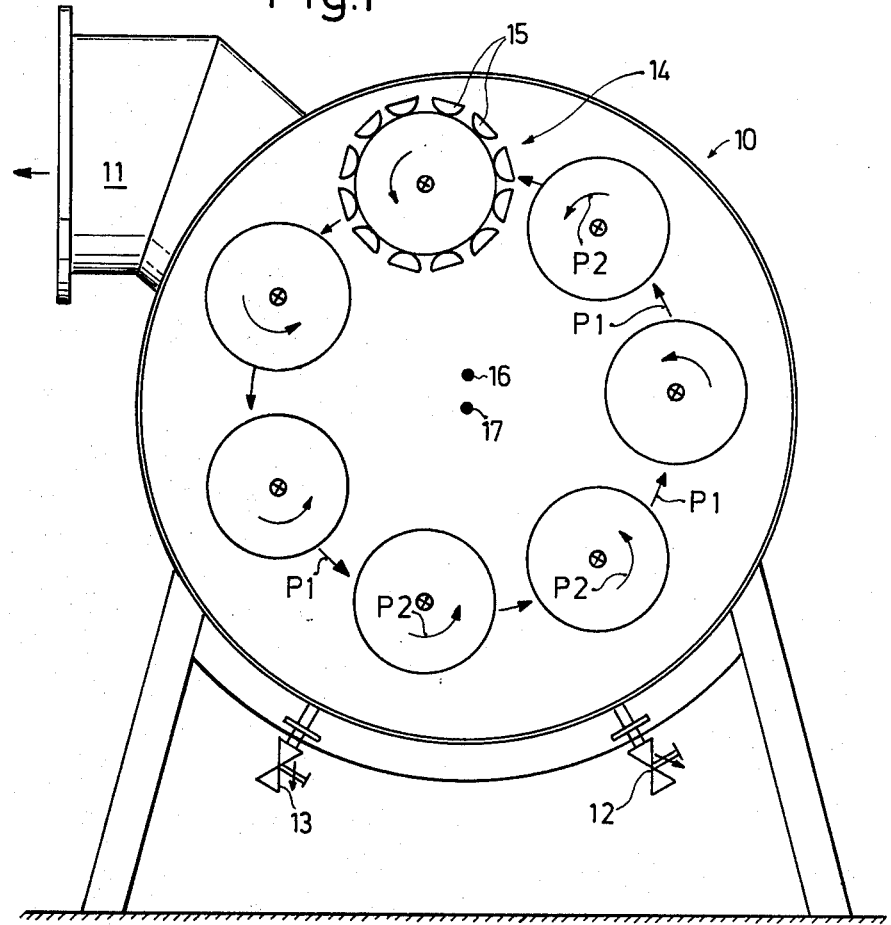

SILICON OXIDE COATED METAL HAVING IMPROVED CORROSION RESISTANCE

The present invention relates to a method to improve the properties, e.g., resistance to corrosion, of silicon oxide protective layers and which are applied on a substrate which has a metal coating, for example, a coating of reflective aluminum on lacquered metal such as unalloyed steel or glass or plastic, to protect the aluminum against corrosion. Such improved reflective aluminum coatings are also part of the present invention. They are used, for example, in reflectors for automotive vehicles and, particularly, in the reflector structures for externally visible automotive lights, such as headlamps.

It has been proposed to protect substrates on which a metal coating has been provided, for example, as used in automotive headlights, by vapor deposition of an inorganic substance such as silicon oxides or $MgF_2$.

The prior art method employed a tungsten wire containing on its surface the metal which is evaporated and then vapor deposited to form the metallic mirror coating. The conditions for this process are disclosed in L. Holland, Vacuum Deposition of Thin Films, Chapman & Hall Ltd, London, 1956. In addition to the tungsten wire which was charged with the metal to be evaporated, the evaporation apparatus also included a tantalum wire bearing on its surface a slurry, or paste containing silicon powder, or a silicon suboxide. To make the protective coating, and after the metal has been evaporated, a metering valve is opened to introduce a small quantity of oxygen into the vapor deposition apparatus. The silicon or silicon suboxide is then evaporated and a silicon oxide compound of indeterminative oxidation state, i.e., $SiO_x$, is formed on the substrate by a vapor deposition reaction. Evaporating conditions are so selected that the oxidation state $x$ of the $SiO_x$ compound will be approximately 2.

Protective layers of this type have the disadvantages that the maximum thickness will be about 50nm. At this maximum thickness which is determined by the loss in reflectivity, the protection of the metal mirror surface against corrosion is limited, particularly in atmospheres which are warm and humid which occur frequently near vehicle headlights.

It is an object of the present invention to provide a silicon oxide layer coated metal mirror having improved corrosion resistance; in particular, reflecting surfaces of vehicle headlights should be effectively protected against the corrosive influences of water, and water vapor.

SUBJECT MATTER OF THE INVENTION

The aforedescribed silicon oxide coated metal is improved by making the silicon oxide coating hydrophobic. The protective layer of silicon oxides is rendered hydrophobic, for example, by introducing into the evaporating vessel, during the introduction of oxygen, a gaseous organosilicon compound which, preferably, has (i) at least one reactive group or at least one reactive atom, and (ii) at least one hydrophobic group.

Investigation has determined that the poor stability of the prior art $SiO_x$ layers is the result of the substantial hydrophilic characteristic of such layers, so that water and water vapor first attack the protective layer and eventually penetrate therethrough so that they can have their corrosive effect on the metallic mirror.

The discovery that rendering the protective layer hydrophobic is surprising even after investigation had determined that the poor protective action of the $SiO_x$ layer is due to its hydrophilic characteristic. It does not necessarily follow that rendering the protective layer hydrophobic would result in better stability of the protective layer in a water vapor atmosphere, since the water impervious characteristic of known hydrophobic layers does not necessarily result in rendering such a layer impervious to water vapor. It is known that such layers are particularly susceptible to corrosion of underlying metallic layers when droplets of water are placed on the protective layer and form edge zones where water, water vapor and air, and the protective layer form a three-phase junction. The combined effect between the hydrophobic portions of the layer apparently cooperate to result in the high protective effect of the cover layer with respect to hydrolysis.

The $SiO_x$ protective layer is rendered hydrophobic by introducing in the vapor deposition chamber during evaporation of silicon and/or a silicon suboxide, oxygen and a gaseous organosilicon. The organosilicon compound must contain at least one reactive molecular group or atom, and at least one hydrophobic molecular group. The vapor pressure of the compound, at room temperature, must be at least $10^{-3}$ mbar. The process is carried out at room temperature.

The reactive molecular groups or atoms which are particularly useful, and are bonded directly to the silicon atom, follow:

(1) alkoxy group —OR;
(2) alkyl amino group —N(H)—R;
(3) dialkylamino group

(4) amido group

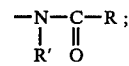

(5) hydrogen, —H wherein
R and R' are equal or different and may be alkyl groups with 1 to 7 C-atoms,
and preferably are methyl- and ethyl groups.

The reactive groups are those which, particularly when they are directly bound to a silicon atom, can readily react with OH—groups.

Hydrophobic groups which are also directly bound to the silicon atom may, for example, be the following:

(6) alkyl groups, e.g., methyl- or ethyl groups;
(7) alkenyl groups, e.g., vinyl-, propenyl- or allyl groups;
(8) aryl groups.

The alkyl and alkenyl groups preferably contain from 1 to 7 carbon atoms, and more preferably from 1 to 2 carbon atoms. The preferred aryl group is: phenyl.

The preferred organosilicon compounds have the formula $A_mSiX_{4-m}$ wherein $m$ is 1, 2, or 3; A is a hydrophobic group and preferably one of those specified in the preceding paragraph, and X is a reactive group, and preferably those specified as being preferred herein.

The preferred $A_mSiX_{4-m}$ compounds are those in which A is vinyl or methyl and X is methoxy and/or ethoxy.

The hydrogen atoms of the A-groups may be partially substituted, especially by fluorine, in order to make the layer more hydrophobic.

A protective layer which is made by vapor deposition from a gaseous mixture prepared by evaporating silicon and/or a silicon suboxide in the presence of oxygen and one of the organosilicon compounds named above, apparently is formed as follows:

As the protective layer forms, the organosilicon compound is introduced as a monomer in the $SiO_x$ layer, possibly through a SiOH group by a condensation reaction which leads to cross-linking, and then produces a layer which is hydrophobic.

The invention will be described by way of example with reference to the drawings in which FIG. 1 depicts in highly schematic form an apparatus for carrying out the process in accordance with the present invention.

FIG. 2 depicts an improved reflector of the present invention.

In FIG. 1, a vessel 10 is connected by means of an exhaust stub 11 to a vacuum pump (not shown). Depending on the size of the vessel 10, at least one metering valve 12 is connected thereto through which a gaseous organosilicon compound, obtained from a supply vessel (not shown) can be introduced. One or more, depending on the (length) size of vessel 10, oxygen inlet valves 13 are located along the length of the vessel, to introduce oxygen from an oxygen container (not shown). Substrate carriers 14 are cylindrical and can rotate about their own axes as well as about the axis of vessel 10. The substrates 15, shown as vehicle headlight reflectors are secured to the carriers 14. They are to be coated with a hydrophobic silicon oxide compound protective layer. The lacquered unalloyed steel reflectors of vehicle headlights, as shown in the drawings, have first been coated (by vapor deposition) with a mirror layer of aluminum; the silicon oxide compound ($SiO_x$) protective layer is then applied on the aluminum mirror surface coating.

An evaporating wire 16 of tungsten is located in the vessel 10, which is essentially cylindrical. The tungsten wire 16 contains aluminum on its surface. Tantalum wire 17 is also located in the vessel 10. It is covered with an aqueous suspension of silicon and/or silicon suboxide powder and is used to effect vapor deposition of the $SiO_x$ layer. Reflectors for automotive vehicle headlights are coated with the hydrophobic $SiO_x$ layer in the apparatus of the FIG. 1 as follows:

A vacuum of about $10^{-4}$ mbar is drawn in vessel 10 by a vacuum pump through part 11. Thereafter, the evaporating wire 16 is heated, so that aluminum evaporates and is vapor deposited on the substrates which are at room temperature. The substrates 15 are moved during deposition on the planetary-like movable carriers 14 about the evaporating wire 16. The carriers 14 rotate about the axis as indicated by the arrows P1 and P2 to show the respective planetary motion of the carriers 14 and with them the reflector bodies substrata 15. In a vessel 10 of a length of 2m and a diameter of 1.5m about 300 substrates with a diameter of about 150 nm are vapour deposited with about 10 g of aluminium in about one minute, the aluminium layer having a thickness of about 100 nm. After the aluminum is vapor deposited, metering valve 12 is opened and a gaseous organosilicon organic compound is introduced. This compound may, for example, be:

Vinyltriethoxysilane, boiling point (BP) 161° C; vinyltris(methoxyethoxy)silane, BP 285° C; methyltriethoxysilane, BP 143° C; dimethyldiethoxysilane, BP 113° C.

The organosilicion compound is obtained from a supply vessel (not shown) in which the respective organosilicon compound is in liquid form. The vapor pressure of a few $10^{-3}$ mbar at 20° C is sufficient in order to obtain a partial pressure of about $0.5 \times 10^{-3}$ mbar in the vessel. The metering valve 13 is then opened to admit oxygen, so that a partial pressure of oxygen of about $0.5 \times 10^{-3}$ mbar in the vessel will result. Within the vessel 10, therefore, an overall pressure of about $1 \times 10^{-3}$ mbar will prevail. In order to obtain continuous gas flow of the gases throughout the apparatus, the vessel 10 remains connected to the vacuum pump during application of the protective layer.

After the vessel 10 has been charged with the gases, an evaporating wire 17 of tantalum containing a surface coating of silicon suboxide or an aqueous slurry of silicon is heated until silicon and/or silicon suboxide, respectively, vaporizes and the hydrophobic protective layer forms on the substrates 15. The vapor deposition conditions are so selected that an absorption-free layer of from 20 to 40 nm thickness will result. This layer will silicon, oxygen, and the molecular residues of the organosilicon compounds which have a relative amount of 10-30 mole-%. After the vapor deposition process is completed, the vessel is opened and the coated headlight reflectors are removed.

The conditions under which the aforedescribed 20-40 nm hydrophobic silicon oxide layer was formed follow: Temperature of the substrates: room temperature. 2 g of Si or SiO are vapor deposited onto the number of substrates mentioned above of the same diameter.

Partial pressure of dimethyldimethoxysilane: 0.5 $10^{-3}$ mbar

Partial pressure of oxygen: 0.5 $10^{-3}$ mbar

Time of vapour deposition: about 5 minutes.

The coated headlight reflectors are formed with the concave reflector substrate 15, e.g., lacquered unalloyed steel, covered with a reflective aluminum layer 18, which is covered by the protective hydrophobic silicon oxide protective layer 19, produced as described hereinbefore. In a typical reflector, the thickness of the substrate, e.g., lacquered unalloyed steel, is between about 0.3 and 2.0 mm and preferably between 0.5 and 1.0 mm; the lacquer layer, consisting of a synthetic resin lacquer such as alkyd melamine resin lacquer, is between 0.01 and 0.02 mm; the metalized layer, e.g., aluminum, is between about 40 and 200 mm, and preferably between 40 and 100 mm; and the protective silicon oxide layer is between about 10 and 50 nm, and preferably about 20 and 40 nm.

Protective layers made in accordance with the process herein show a protective effect in a warm humid atmosphere which is at least three times better than that which has not been hydrophobically treated. The protective layers are stable in temperatures to 150° C and have a resistance against wiping which is better than that of non-hydrophobically treated layers.

We claim:

1. In the process of producing a protective transparent layer of silicon oxide of a thickness between about 10 and 50 nm by vapor deposition on a metal surface comprising vapor depositing silicon oxide from a gaseous mixture of at least one material selected from the group consisting of silicon and silicon oxide, and oxygen in a vacuum chamber under vacuum conditions, at room temperature the improvement comprising including as a gaseous component of said vacuum chamber, an organosilicon compound having a vapor pressure of at least $10^{-3}$ mbar at room temperature, said organosilicon compound containing at least one reactive group or atom which can readily react with —OH groups and at least one hydrophobic group to produce a hydrophobic silicon oxide layer between about 10 and 50 nm thick incorporating said hydrophobic groups.

2. The process of claim 1 wherein at least some of the hydrogen atoms on said hydrophobic group are substituted by fluorine atoms.

3. The process of claim 1 wherein said organosilicon compound has the formula $A_m SiX_{4-m}$ wherein $m$ is 1, 2 or 3; each X is a reactive group selected from the group consisting of alkoxy, alkylamino, dialkylamino, amido, and hydrogen, and each A is a hydrophobic group selected from the group consisting of alkyl, alkenyl and aryl.

4. A composite article comprising a light reflector comprising a substrate having a reflective metalized layer between about 40 and 200 nm thick with a protective transparent hydrophobic silicon oxide layer between about 10 and 50 nm thick coating said metalized layer, said hydrophobic layer having been formed by vapor deposition of a silicon oxide layer incorporating reaction product hydrophobic groups from a gaseous mixture comprising silicon, oxygen, and an organosilicon compound having formula $A_m SiX_{4-m}$ wherein $m$ is 1, 2 or 3; each X is a reactive group or element selected from the group consisting of —OR, —N(H)R, —N(R)R; —N(R')C(O)R, and H, wherein R and R' are each an alkyl containing 1-7 carbon atoms; and each A is a hydrophobic group selected from the group consisting of alkyls, alkenyls and aryls containing from 1 to 7 carbon atoms.

5. The composite article of claim 4 wherein said hydropbic silicon oxide layer consists essentially of silicon, oxygen, and the molecular residues of organosilicon compounds, said residues of organosilicon compounds being in an amount of between 10 and 30 mole percent of said hydrophobic silicon oxide layer.

6. The composite article of claim 5 wherein said substrate is a lacquered steel with a steel thickness of between about 0.5 and 1.0 mm and a lacquer layer between about 0.01 and 0.02 nm; wherein said metalized layer is an aluminum layer between about 40 and 100 space nm; and said protective hydrophobic silicon oxide layer is between 20 and 40 nm.

7. The composite article of claim 6 wherein said organosilicon compound is selected from the group consisting of vinyltriethoxysilane, vinyltri(methoxyethoxy)silane, methyltriethoxysilane, and dimethyldiethoxysilane.

8. The composite article of claim 4 wherein said organosilicon compound is selected from the group consisting of vinyltriethoxysilane, vinyltris(methoxyethoxy)silane, methyltriethoxysilane, and dimethyldiethoxysilane.

9. The composite article of claim 8 wherein said hydrophobic silicon oxide layer consists essentially of silicon, oxygen, and the molecular residues of organosilicon compounds, said residues of organosilicon compounds being in an amount between 10 and 30 mole percent of said hydrophobic silicon oxide layer.

10. The composite article of claim 4 wherein said R and R' groups which are constituents of the reactive groups X contain 1 or 2 carbon atoms and wherein when said hydrophobic groups are alkyl or alkenyl they contain 1 or 2 carbon atoms and when aryl, are phenyl.

11. The composite article of claim 10 wherein said substrate comprises a lacquer-coated steel, said steel being between about 0.3 and 20 mm, and said lacquer being between about 0.01 and 0.02 mm.

12. The composite article of claim 11 wherein said steel is between about 0.5 and 1.0 mm, said metalized layer is an aluminum layer between 40 and 100 nm, and said hydrophobic silicon oxide layer is between about 20 and 40 nm.

13. The composite article of claim 12 wherein said hydrophobic silicon oxide layer consists essentially of silicon, oxygen, and the molecular residues of organosilicon compounds, said residues of organosilicon compounds being in an amount of between 10 and 30 mole percent of said hydrophobic silicon oxide layer.

* * * * *

UNITED STATES PATENT AND TRADEMARK OFFICE
CERTIFICATE OF CORRECTION

PATENT NO. : 4,105,821

DATED : August 8, 1978

INVENTOR(S) : BERNHARD BLAICH et al

It is certified that error appears in the above-identified patent and that said Letters Patent are hereby corrected as shown below:

Column 5, line 14, replace "1" with ---3---.

Signed and Sealed this

Fourteenth Day of August 1979

[SEAL]

Attest:

LUTRELLE F. PARKER

Attesting Officer    Acting Commissioner of Patents and Trademarks